(12) United States Patent
Mustafa et al.

(10) Patent No.: US 11,710,756 B2
(45) Date of Patent: Jul. 25, 2023

(54) INTEGRATING OPTICAL ELEMENTS WITH ELECTRO-OPTICAL SENSORS VIA DIRECT-BOND HYBRIDIZATION

(71) Applicant: RAYTHEON COMPANY, Waltham, MA (US)

(72) Inventors: Jamal I. Mustafa, Goleta, CA (US); Robert C. Anderson, Santa Barbara, CA (US); John L. Vampola, Santa Barbara, CA (US); Sean P. Kilcoyne, Lompoc, CA (US); Eric R. Miller, Orcutt, CA (US); George Grama, Orcutt, CA (US)

(73) Assignee: RAYTHEON COMPANY, Waltham, MA (US)

( * ) Notice: Subject to any disclaimer, the term of this patent is extended or adjusted under 35 U.S.C. 154(b) by 196 days.

(21) Appl. No.: 16/952,783

(22) Filed: Nov. 19, 2020

(65) Prior Publication Data

US 2022/0157881 A1    May 19, 2022

(51) Int. Cl.
  *H01L 27/146* (2006.01)

(52) U.S. Cl.
  CPC .... *H01L 27/14634* (2013.01); *H01L 27/1469* (2013.01); *H01L 27/14621* (2013.01); *H01L 27/14625* (2013.01); *H01L 27/14685* (2013.01); *H01L 27/14687* (2013.01); *H01L 27/1462* (2013.01)

(58) Field of Classification Search
  CPC ............. H01L 27/146; H01L 27/14601; H01L 27/1462; H01L 27/14621; H01L 27/14625; H01L 27/1463; H01L 27/14632; H01L 27/14634; H01L 27/14645; H01L 27/14667; H01L 27/14683; H01L 27/14685; H01L 27/14687; H01L 27/1469; G02F 1/1335; G02F 1/133514
  See application file for complete search history.

(56) References Cited

U.S. PATENT DOCUMENTS 8,071,872 B2    12/2011  Atanackovic
2010/0245638 A1*  9/2010  Ota .................. H01L 27/14621
                                                      348/E5.091

(Continued)

FOREIGN PATENT DOCUMENTS

| EP | 2239777 A2 | 10/2010 |
| EP | 2287910 A1 | 2/2011 |
| EP | 3219834 A1 | 9/2017 |

OTHER PUBLICATIONS

International Search Report and Written Opinion issued in PCT/US2021/059058; Application Filing Date Nov. 12, 2021; dated Mar. 1, 2022 (12 pages).

*Primary Examiner* — Cheung Lee
(74) *Attorney, Agent, or Firm* — Cantor Colburn LLP (57) ABSTRACT

A direct-bond hybridization (DBH) method is provided to assemble a sensor wafer device. The DBH method includes fabricating an optical element on a handle wafer and depositing first oxide with n-x thickness on the optical element where n is an expected final oxide thickness of the sensor wafer, depositing second oxide with x thickness onto a sensor wafer, executing layer transfer of the optical element by a DBH fusion bond technique to the sensor wafer whereby the first and second oxides form an oxide layer of n thickness between the optical element and the sensor wafer and removing the handle wafer.

19 Claims, 5 Drawing Sheets

(56) References Cited

U.S. PATENT DOCUMENTS

| | | | |
|---|---|---|---|
| 2014/0175586 A1* | 6/2014 | Kim | H01L 27/14621 |
| | | | 257/432 |
| 2014/0339606 A1* | 11/2014 | Lin | H01L 27/14621 |
| | | | 438/70 |
| 2015/0279816 A1 | 10/2015 | Chen et al. | |
| 2017/0062366 A1 | 3/2017 | Enquist | |
| 2018/0204798 A1 | 7/2018 | Enquist et al. | |
| 2018/0330992 A1 | 11/2018 | Delacruz et al. | |

* cited by examiner

INTEGRATING OPTICAL ELEMENTS WITH ELECTRO-OPTICAL SENSORS VIA DIRECT-BOND HYBRIDIZATION

BACKGROUND

The present disclosure relates to electro-optical sensors and, in particular, to optical elements integrated with electro-optical sensors via direct-bond hybridization.

Solid-state optical elements (e.g., coatings and filters) can be deposited directly on a sensor in conventional cases. This is typically problematic, however, because the resulting structure is not amenable to rework and can put high-value parts at risk of damage or failure. In the separate case of discrete optical elements, these must be aligned and mounted in an optical chain. This can be a laborious process requiring expensive bezel materials and results in a vertical gap that can be detrimental to imaging.

In the particular case of Bayer filters, it is understood that Bayer filters are usually applied to focal plane arrays using a repetitive photolithography/lift-off process or a spin-on organic based film. The application of this process does not produce a 100% yield due to photolithography defects and possible processing lift-off debris. While this potential risk is sometimes acceptable on low-cost commercial applications, the risk is unacceptable for high-value sensors.

SUMMARY

According to an aspect of the disclosure, a direct-bond hybridization (DBH) method is provided to assemble a sensor wafer device. The DBH method includes fabricating an optical element on a handle wafer and depositing first oxide with n-x thickness on the optical element where n is an expected final oxide thickness of the sensor wafer, depositing second oxide with x thickness onto a sensor wafer, executing layer transfer of the optical element by a DBH fusion bond technique to the sensor wafer whereby the first and second oxides form an oxide layer of n thickness between the optical element and the sensor wafer and removing the handle wafer.

In accordance with additional or alternative embodiments, the n-x thickness is equal to the x thickness.

In accordance with additional or alternative embodiments, the depositing of the first oxide and the depositing of the second oxide respectively include planarizing.

In accordance with additional or alternative embodiments, the first oxide and the second oxide are bonding oxides.

In accordance with additional or alternative embodiments, the sensor wafer includes a sensor chip assembly (SCA) wafer.

In accordance with additional or alternative embodiments, the optical element includes at least one or more of anti-reflection coatings, spectral filters, butcher-block or multi-spectral filters, Bayer filters, order-sorting filters, microlenses, neutral density filters, optical limiters, mirrors, dark mirror coatings, solid-state shutters and polarizers.

According to an aspect of the disclosure, a direct-bond hybridization (DBH) method is provided to assemble a sensor wafer device. The DBH method includes fabricating a Bayer filter pattern with varying thicknesses at various pattern sections on a handle wafer and depositing first oxide with n-x thickness at each of the various pattern sections by accounting for the varying thicknesses where n is an expected final oxide thickness of the sensor wafer, depositing second oxide with x thickness onto a sensor wafer, executing layer transfer of the Bayer filter pattern by a DBH fusion bond technique to the sensor wafer whereby the first and second oxides form an oxide layer of n thickness between the Bayer filter pattern and the sensor wafer and removing the handle wafer.

In accordance with additional or alternative embodiments, the n-x thickness is different from the x thickness.

In accordance with additional or alternative embodiments, the depositing of the first oxide and the depositing of the second oxide respectively include planarizing.

In accordance with additional or alternative embodiments, the first oxide and the second oxide are bonding oxides.

In accordance with additional or alternative embodiments, the fabricating of the Bayer filter pattern includes patterning alignment targets on the handle wafer and executing multiple rounds of photolithography, thin-film deposition and thin-film solvent soak lift-off to form RBGY filters at the various pattern sections with targeted spectral performance and an offset for the first oxide.

In accordance with additional or alternative embodiments, the depositing of the first oxide includes depositing various thicknesses of the first oxide at each of the various pattern sections.

In accordance with additional or alternative embodiments, the depositing of the first oxide further includes measuring final thicknesses at each of the various pattern sections and screening for defects.

In accordance with additional or alternative embodiments, the sensor wafer includes a read-out integrated circuit (ROIC) substrate, ROIC integrated circuit (IC)/interlayer dielectric (ILD) layers disposed on the ROIC substrate, a DBH integration layer disposed on the IC/ILD layers and a detector layer disposed on the DBH integration layer.

In accordance with additional or alternative embodiments, the executing of the layer transfer by the DBH fusion bond technique includes aligning the Bayer filter pattern to the sensor wafer with sub-micron filter alignment.

According to an aspect of the disclosure, a direct-bond hybridization (DBH) sensor wafer is provided and includes a sensor wafer including a detector layer and a Bayer filter transferred onto the detector layer of the sensor wafer with DBH fusion bond technology. The Bayer filter includes a Bayer filter pattern with varying thicknesses at various pattern sections, bonding oxide between the various pattern sections and the detector layer and having various thicknesses at each of the various pattern sections and surrounding oxide surrounding the Bayer filter pattern and the bonding oxide.

In accordance with additional or alternative embodiments, the Bayer filter pattern includes RBGY filters at the various pattern sections.

In accordance with additional or alternative embodiments, the sensor wafer includes a read-out integrated circuit (ROIC) substrate, ROIC integrated circuit (IC)/interlayer dielectric (ILD) layers disposed on the ROIC substrate, a DBH integration layer disposed on the IC/ILD layers and the detector layer disposed on the DBH integration layer.

In accordance with additional or alternative embodiments, the Bayer filter has sub-micron filter alignment with the sensor wafer.

In accordance with additional or alternative embodiments, the Bayer filter is narrower than the sensor wafer.

Additional features and advantages are realized through the techniques of the present disclosure. Other embodiments and aspects of the disclosure are described in detail herein and are considered a part of the claimed technical concept.

For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a method is provided in which optical elements are fabricated on a separate handle wafer. The method allows for fabrication to be completed separately from a sensor and thus leverages economies of scale, improves yield, offers the potential for rework, reduces cycle time and provides for wafer-scale processing. The method eliminates the need for expensive mounting structures and reduces vertical gaps of discrete filters and requires careful design of optical elements such that the design considers the bonding oxide necessary for direct-bond hybridization (DBH).

For a case of a Bayer filter, the processing yield loss will be only realized on a temporary handle wafer and not high-value assets. By using DBH processing technology, the Bayer filter is processed on a cheap temporary handle wafer which is later screened for defects and down selected for use. The patterned Bayer filter wafer can then be aligned, fusion bonded and layer transferred to the high-value product wafer using the DBH bond and layer transfer technology.

Figure 1:
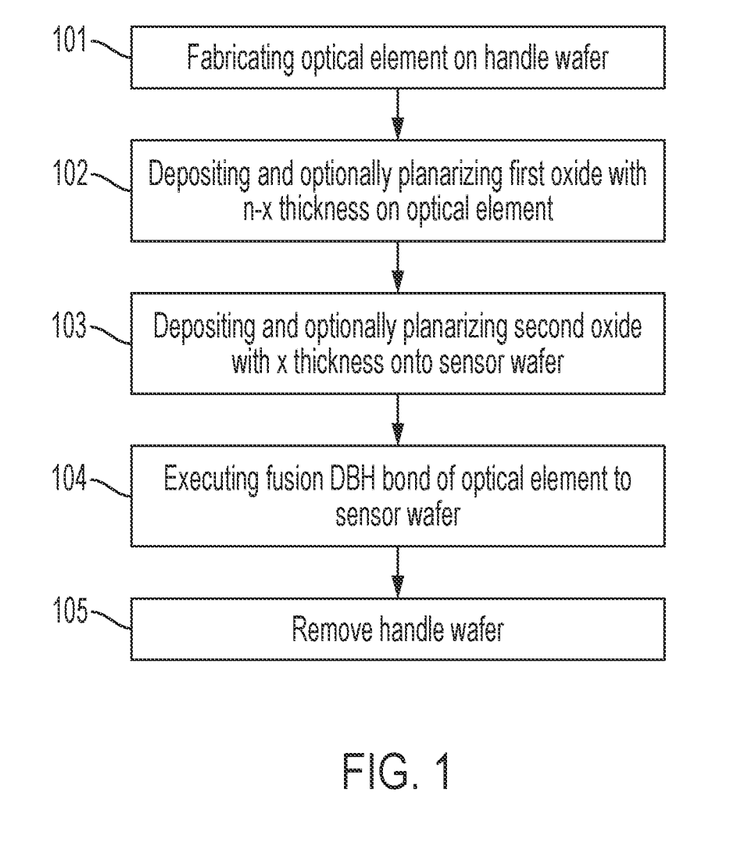
FIG. 1 is a flow diagram illustrating a direct-bond hybridization (DBH) method in accordance with embodiments.
Figure 2:
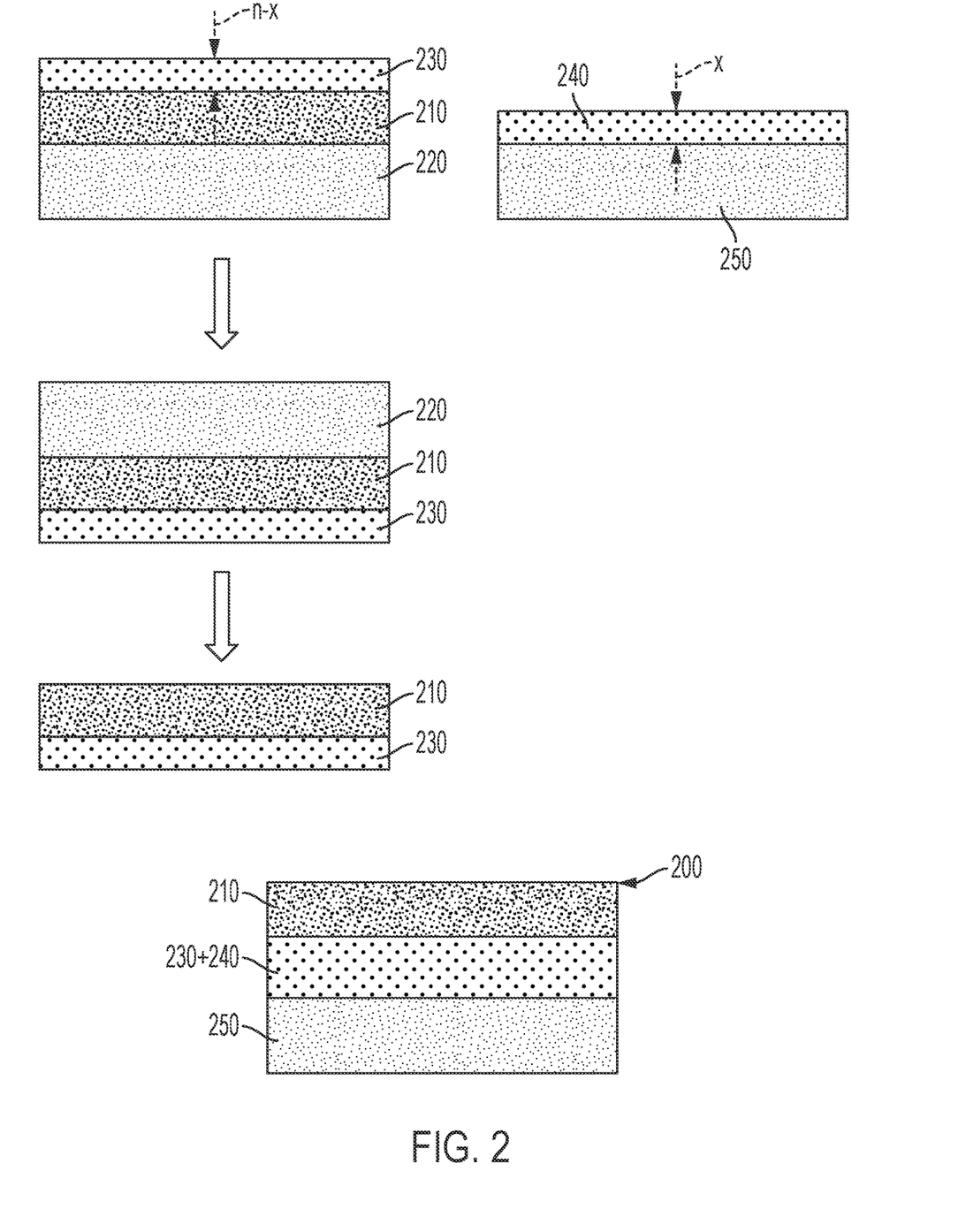
FIG. 2 is a graphical diagram illustrating the DBH method of FIG. 1 in accordance with embodiments.

With reference to FIGS. 1 and 2, a DBH method to assemble a sensor wafer device 200 is provided. The DBH method includes fabricating an optical element 210 on a handle wafer 220 (block 101) and depositing and optionally planarizing first oxide 230 with n-x thickness on the optical element 210 (block 102) where n is an expected final oxide thickness of the sensor wafer device 200. The method further includes depositing and optionally planarizing second oxide 240 with x thickness onto a sensor wafer 250 (block 103) and executing layer transfer of the optical element 210 by a DBH fusion bond technique to the sensor wafer 250 (block 104). The sensor wafer 250 can include or be provided as a sensor chip assembly (SCA) wafer and the optical element 210 can include or be provided as at least one or more of anti-reflection coatings, spectral filters, butcher-block or multi-spectral filters, Bayer filters, order-sorting filters, micro-lenses, neutral density filters, optical limiters, mirrors, dark mirror coatings, solid-state shutters and polarizers. The executing of the layer transfer by the DBH fusion bond technique of block 104 can include flipping over the first oxide 230, the optical element 210 and the handle wafer 220 and bonding the first oxide 230 to the second oxide 240. Both of the first oxide 230 and the second oxide 240 can include or be provided as bonding oxides. A result of the executing of the layer transfer by the DBH fusion bond technique of block 104 is that the first oxide 230 and the second oxide 240 form an oxide layer of the n thickness between the optical element 210 and the sensor wafer 250. The method can also include a removing of the handle wafer 220 (block 105) prior to or following the execution of the layer transfer by the DBH fusion bond technique of block 104.

In accordance with embodiments, the n-x thickness is equal to the x thickness in cases where the first oxide 230 and the second oxide 240 have the same thickness. In accordance with alternative embodiments, the n-x thickness is different from the x thickness in cases where the first oxide 230 and the second oxide 240 have different thicknesses.

Figure 3:
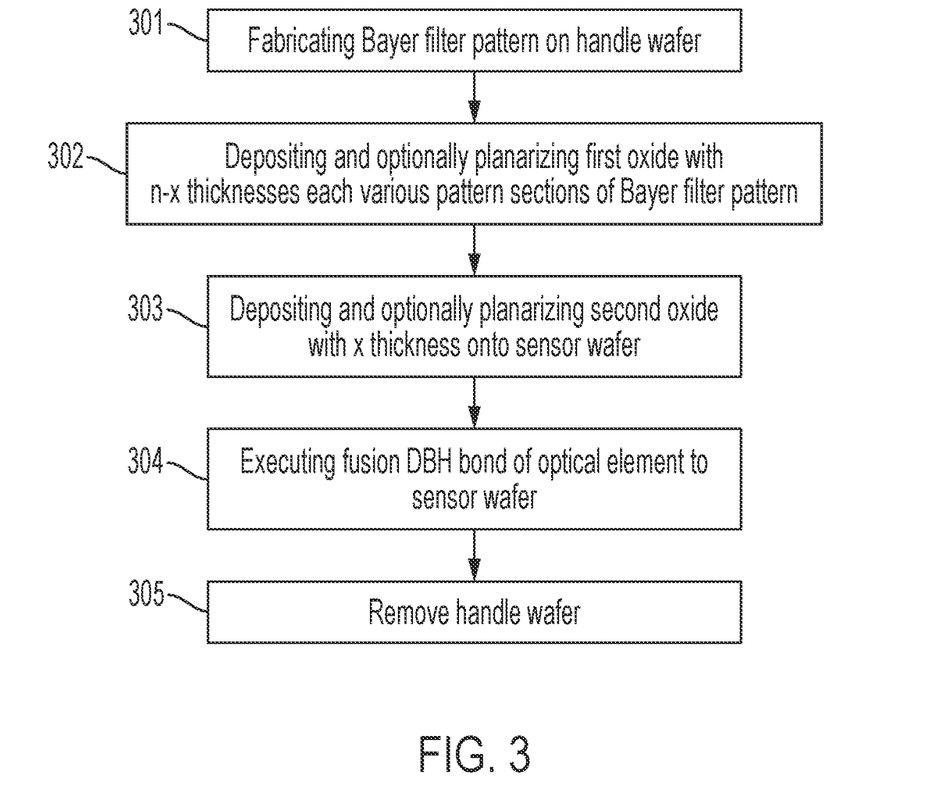
FIG. 3 is a flow diagram illustrating a direct-bond hybridization (DBH) method for use with a Bayer filter in accordance with embodiments.
Figure 4:
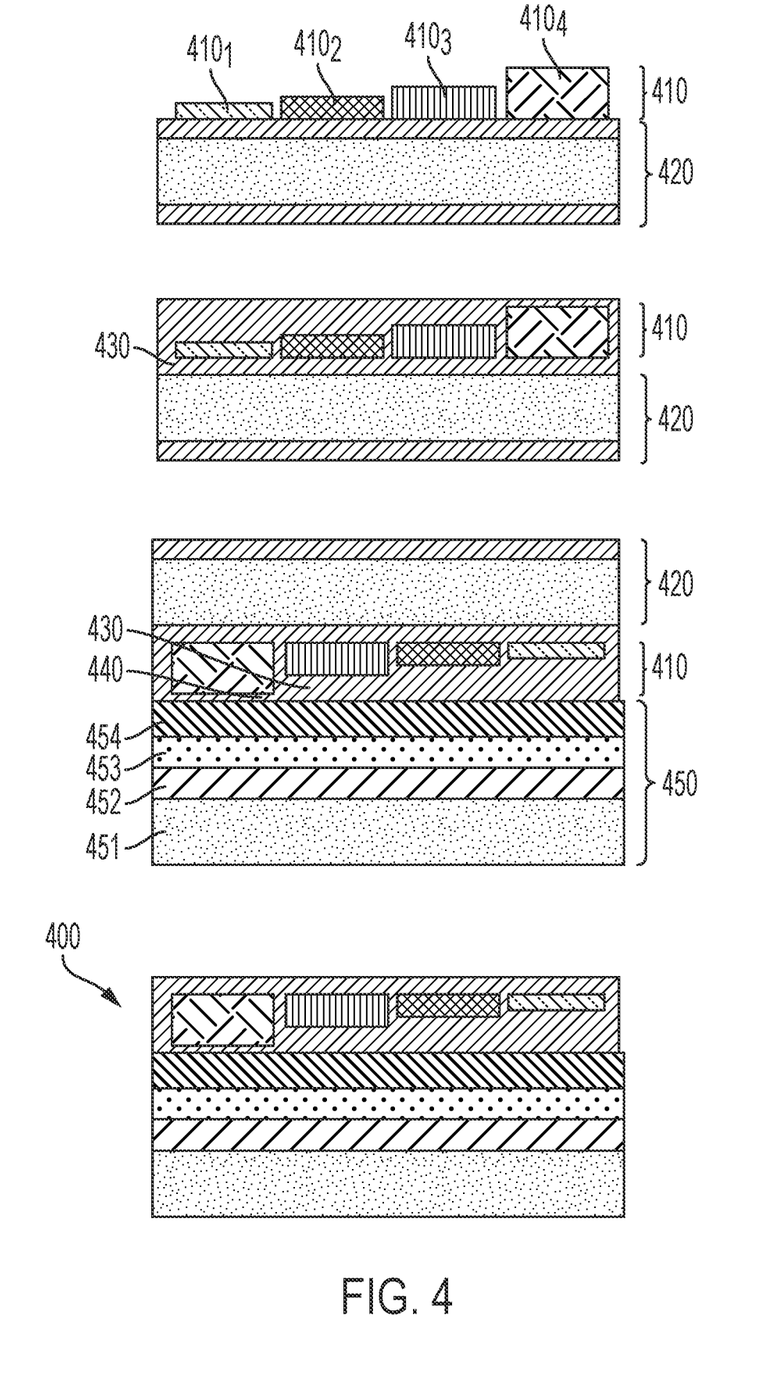
FIG. 4 is a graphical diagram illustrating the DBH method of FIG. 3 in accordance with embodiments.

With reference to FIGS. 3 and 4, a DBH method to assemble a sensor wafer device 400 is provided. The DBH method includes fabricating a Bayer filter pattern 410 with varying thicknesses $T_{1-4}$ at various pattern sections $410_{1-4}$ on a handle wafer 420 (block 301). The method further includes depositing and optionally planarizing first oxide 430 with n-x (see FIG. 2) thickness at each of the various pattern sections $410_{1-4}$ by accounting for the varying thicknesses of each of the various pattern sections $410_{1-4}$ (block 302) where n is an expected final oxide thickness of the sensor wafer device 400 and depositing and planarizing second oxide 440 with x (see FIG. 2) thickness onto a detector side of a sensor wafer 450 (block 303). The sensor wafer 450 can include multiple levels including a read-out integrated circuit (ROIC) substrate 451, ROIC integrated circuit (IC)/interlayer dielectric (ILD) layers 452 disposed on the ROIC substrate 451, a DBH integration layer 453 disposed on the IC/ILD layers 452 and a detector layer 454 disposed on the DBH integration layer 453. The method also includes executing a layer transfer of the Bayer filter pattern by a DBH fusion bond technique of the Bayer filter pattern 410 to the detector side of the sensor wafer 450 (block 304). The executing of the layer transfer by the DBH fusion bond technique of block 304 can include flipping over the first oxide 430, the Bayer filter pattern 410 and the handle wafer 420 and bonding the first oxide 430 to the second oxide 440. Both of the first oxide 430 and the second oxide 440 can include or be provided as bonding oxides. A result of the executing of the layer transfer by the DBH fusion bond technique of block 304 is that the first oxide 430 and the second oxide 440 form an oxide layer of the n thickness between the Bayer filter pattern 410 and the sensor wafer 450. The method can also include a removing of the handle wafer 420 (block 305) prior to or following the execution of the layer transfer by the DBH fusion bond technique of block 304.

The fabricating of the Bayer filter pattern 410 of block 301 can include patterning alignment targets on the handle wafer 420, executing multiple rounds of photolithography, thin-film deposition and think-film solvent soak lift-off to form RBGY filters at the various pattern sections $410_{1-4}$ with targeted spectral performance and an offset for the first oxide 430. The depositing and optional planarizing of the first oxide 430 of block 302 can include depositing various thicknesses of the first oxide 430 at each of the various pattern sections $410_{1-4}$, measuring final thicknesses at each of the various pattern sections $410_{1-4}$ and screening for defects. The executing of the layer transfer by the DBH fusion bond technique of block 304 can include aligning the Bayer filter pattern 410 to the sensor wafer 450 with sub-micron level filter alignment.

In accordance with alternative embodiments, the n-x thickness is different from the x thickness in cases where the first oxide 230 and the second oxide 240 have different thicknesses. In accordance with alternative embodiments, the n-x thickness is equal to the x thickness in cases where the first oxide 230 and the second oxide 240 have the same thickness.

Figure 5:
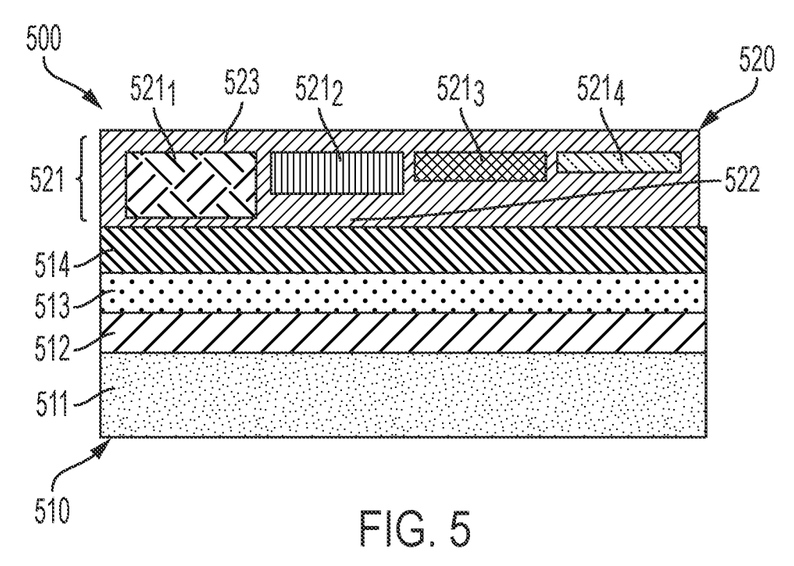
FIG. 5 is an enlarged side view of a DBH sensor wafer in accordance with embodiments.

With reference to FIG. 5, a DBH sensor wafer device 500 is provided generally as a result of the method of FIGS. 3 and 4. The DBH sensor wafer 500 includes a sensor wafer 510 and a Bayer filter 520. The sensor wafer 510 includes a ROIC substrate 511, IC/ILD layers 512 disposed on the ROIC substrate 511, a DBH integration layer 513 disposed on the IC/ILD layers 512 and a detector layer 514 disposed on the DBH integration layer 513. The Bayer filter 520 is transferred on the detector layer 514 of the sensor wafer 510 with DBH fusion bond methodology as described above. The Bayer filter 520 includes a Bayer filter pattern 521 with RGBY filters and varying thicknesses at various pattern sections $521_{1-4}$, bonding oxide 522 between the various pattern sections $521_{1-4}$ and the detector layer 514 and having various thicknesses at each of the various pattern sections $521_{1-4}$ and surrounding oxide 523 surrounding the Bayer filter pattern 521 and the bonding oxide 522. The Bayer filter 520 can achieve sub-micron level filter alignment with the sensor wafer 510.

Technical effects and benefits of the present disclosure are a capability of fabricating optical elements on a separate handle wafer rather than a sensor wafer. The fabrication is thus completed separately from a sensor and leverages economies of scale, improves yield, offers the potential for rework, reduces cycle time and provides for wafer-scale processing. Needs for expensive mounting structures are eliminated and vertical gaps of discrete filters are reduced. For a case of a Bayer filter, processing yield losses will be only realized on a temporary handle wafer and not high-value assets. By using DBH processing technology, the Bayer filter is processed on a cheap temporary handle wafer which is later screened for defects and down selected for use. The patterned Bayer filter wafer can then be aligned, fusion bonded and layer transferred to the high-value sensor/product wafer using the DBH bond and layer transfer technology.

The corresponding structures, materials, acts and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A direct-bond hybridization (DBH) method to assemble a sensor wafer device, the DBH method comprising:
    fabricating an optical element on a handle wafer and depositing first oxide with n-x thickness on the optical element where n is an expected final oxide thickness of the sensor wafer;
    depositing second oxide with x thickness onto a sensor wafer;
    executing layer transfer of the optical element by a DBH fusion bond technique to the sensor wafer whereby the first and second oxides form an oxide layer of n thickness between the optical element and the sensor wafer; and
    removing the handle wafer.

2. The method according to claim 1, wherein the n-x thickness is equal to the x thickness.

3. The method according to claim 1, wherein the depositing of the first oxide and the depositing of the second oxide respectively comprise planarizing.

4. The method according to claim 1, wherein the first oxide and the second oxide are bonding oxides.

5. The method according to claim 1, wherein the sensor wafer comprises a sensor chip assembly (SCA) wafer.

6. The method according to claim 1, wherein the optical element comprises at least one or more of anti-reflection coatings, spectral filters, butcher-block or multi-spectral filters, Bayer filters, order-sorting filters, micro-lenses, neutral density filters, optical limiters, mirrors, dark mirror coatings, solid-state shutters and polarizers.

7. A direct-bond hybridization (DBH) method to assemble a sensor wafer device, the DBH method comprising:
    fabricating a Bayer filter pattern with varying thicknesses at various pattern sections on a handle wafer and depositing first oxide with n-x thickness at each of the various pattern sections by accounting for the varying thicknesses where n is an expected final oxide thickness of the sensor wafer;
    depositing second oxide with x thickness onto a sensor wafer;
    executing layer transfer of the Bayer filter pattern by a DBH fusion bond technique to the sensor wafer whereby the first and second oxides form an oxide layer of n thickness between the Bayer filter pattern and the sensor wafer; and
    removing the handle wafer.

8. The method according to claim 7, wherein the n-x thickness is different from the x thickness.

9. The method according to claim 7, wherein the depositing of the first oxide and the depositing of the second oxide respectively comprise planarizing.

10. The method according to claim 7, wherein the first oxide and the second oxide are bonding oxides.

11. The method according to claim 7, wherein the fabricating of the Bayer filter pattern comprises:
    patterning alignment targets on the handle wafer; and
    executing multiple rounds of photolithography, thin-film deposition and thin-film solvent soak lift-off to form RBGY filters at the various pattern sections with targeted spectral performance and an offset for the first oxide.

12. The method according to claim 7, wherein the depositing of the first oxide comprises depositing various thicknesses of the first oxide at each of the various pattern sections.

13. The method according to claim 12, wherein the depositing of the first oxide further comprises:
    measuring final thicknesses at each of the various pattern sections; and
    screening for defects.

14. The method according to claim 7, wherein the sensor wafer comprises:
    a read-out integrated circuit (ROIC) substrate;
    ROIC integrated circuit (IC)/interlayer dielectric (ILD) layers disposed on the ROIC substrate;
    a DBH integration layer disposed on the IC/ILD layers; and
    a detector layer disposed on the DBH integration layer.

15. The method according to claim 7, wherein the executing of the layer transfer by the DBH fusion bond technique comprises aligning the Bayer filter pattern to the sensor wafer with sub-micron filter alignment.

16. A direct-bond hybridization (DBH) sensor wafer, comprising:
    a sensor wafer comprising a read-out integrated circuit (ROIC) substrate, ROIC integrated circuit (IC)/interlayer dielectric (ILD) layers disposed on the ROIC substrate, a DBH integration layer disposed on the IC/ILD layers and a detector layer disposed on the DBH integration layer; and
    a Bayer filter transferred onto the detector layer of the sensor wafer with DBH fusion bond technology and comprising:
    a Bayer filter pattern with varying thicknesses at various pattern sections;
    bonding oxide between the various pattern sections and the detector layer and having various thicknesses at each of the various pattern sections; and
    surrounding oxide surrounding the Bayer filter pattern and the bonding oxide.

17. The DBH sensor wafer according to claim 16, wherein the Bayer filter pattern comprises RBGY filters at the various pattern sections.

18. The DBH sensor wafer according to claim 16, wherein the Bayer filter has sub-micron filter alignment with the sensor wafer.

19. The DBH sensor wafer according to claim 16, wherein the Bayer filter is narrower than the sensor wafer.

* * * * *